US012753498B2

(12) United States Patent
Yan et al.

(10) Patent No.: US 12,753,498 B2
(45) Date of Patent: Oct. 6, 2026

(54) METHODS OF GROWING METAL-CONTAINING FILMS

(71) Applicant: Applied Materials, Inc., Santa Clara, CA (US)

(72) Inventors: Haoming Yan, Santa Clara, CA (US); Shih Chung Chen, Cupertino, CA (US); Mandyam Sriram, San Jose, CA (US); EunKee Hong, Santa Clara, CA (US); Janardhan Devrajan, Santa Clara, CA (US); Lakmal C. Kalutarage, San Jose, CA (US); Yongjing Lin, San Jose, CA (US); Lisa Michelle Mandrell, Santa Clara, CA (US); Arkaprava Dan, San Jose, CA (US); Liqi Wu, San Jose, CA (US); Pratham Jain, Santa Clara, CA (US); Jeffrey Anthis, San Jose, CA (US); Mark Saly, Santa Clara, CA (US); Mei Chang, Saratoga, CA (US); David Thompson, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 479 days.

(21) Appl. No.: 18/135,024

(22) Filed: Apr. 14, 2023

(65) Prior Publication Data

US 2023/0295803 A1 Sep. 21, 2023

Related U.S. Application Data

(63) Continuation-in-part of application No. 17/084,184, filed on Oct. 29, 2020, now abandoned.

(Continued)

(51) Int. Cl.
*C23C 16/455* (2006.01)
*C23C 16/56* (2006.01)
(Continued)

(52) U.S. Cl.
CPC ........ *C23C 16/45553* (2013.01); *C23C 16/56* (2013.01); *H10D 64/01* (2025.01);
(Continued)

(58) Field of Classification Search
CPC .... H10P 14/412; H10P 14/432; H10P 14/416; H10P 14/418
See application file for complete search history.

(56) References Cited

U.S. PATENT DOCUMENTS

2002/0182320 A1 12/2002 Leskela et al.
2005/0208763 A1 9/2005 Byun
(Continued)

FOREIGN PATENT DOCUMENTS

TW 200839029 A 10/2008

OTHER PUBLICATIONS

International Search Report and Written Opinion dated Jul. 18, 2024 for Application No. PCT/US2024/022625.
(Continued)

*Primary Examiner* — Alexander G Ghyka
(74) *Attorney, Agent, or Firm* — Patterson + Sheridan, LLP

(57) ABSTRACT

Methods of forming metal-containing films for electronic devices (e.g., logic devices and/or memory devices) and methods for reducing equivalent oxide thickness (EOT) penalty in electronic devices are disclosed. The methods comprise exposing a substrate surface to a metal precursor, such as titanium chloride ($TiCl_4$), a reducing agent, such as a cyclic 1,4-diene, and a reactant, ammonia ($NH_3$), either (Continued)

simultaneously, partially simultaneously or separately and sequentially to form the metal-containing film.

17 Claims, 6 Drawing Sheets

Related U.S. Application Data

(60) Provisional application No. 62/927,676, filed on Oct. 29, 2019.

(51) Int. Cl.
*H10D 64/01* (2025.01)
*H10P 14/40* (2026.01)
*H10P 95/00* (2026.01)

(52) U.S. Cl.
CPC ..... *H10D 64/0113* (2026.01); *H10D 64/0116* (2026.01); *H10P 14/416* (2026.01); *H10P 14/418* (2026.01); *H10P 95/00* (2026.01)

(56) References Cited

U.S. PATENT DOCUMENTS

| | | | | |
|---|---|---|---|---|
| 2006/0019495 | A1 | 1/2006 | Marcadal et al. | |
| 2008/0182410 | A1 | 7/2008 | Elers et al. | |
| 2008/0182411 | A1 | 7/2008 | Elers | |
| 2011/0057292 | A1* | 3/2011 | Hu ........................ | H10B 12/033 257/532 |
| 2015/0004314 | A1 | 1/2015 | Winter et al. | |
| 2021/0123136 | A1 | 4/2021 | Kalutarage et al. | |
| 2023/0005925 | A1 | 1/2023 | Jung et al. | |

OTHER PUBLICATIONS

Taiwan Office Action dated May 29, 2024 for Application No. 11320541430.

"MOS Capacitor", Electrical Engineering & Computer Sciences, Chapter 5, [retrieved on Feb. 13, 2009], <URL: https://www.chu.berkeley.edu/wp-content/uploads/2020/01/Chenming-Hu_ch5-1.pdf>, pp. 157-194.

PCT International Search Report and Written Opinion in PCT/US2020/057893 dated Feb. 23, 2021, 12 pages.

Klesko, Joseph P., et al., "Thermal Atomic Layer Deposition of Titanium Films Using Titanium Tetrachloride and 2-Methyl-1,4-bis(trimethylsilyl)-2,5-cyclohexadiene or 1,4-Bis(trimethylsilyl)-1,4-dihydropyrazine", Chem. Mater., 2015, vol. 27, pp. 4918-4921, along with Supporting Information, 36 pages.

* cited by examiner

METHODS OF GROWING METAL-CONTAINING FILMS

CROSS-REFERENCE TO RELATED APPLICATIONS

This application is a continuation-in-part of U.S. patent application Ser. No. 17/084,184, filed Oct. 29, 2020, which claims priority to U.S. Provisional Application No. 62/927,676, filed Oct. 29, 2019, the entire disclosures of which are hereby incorporated by reference herein.

TECHNICAL FIELD

Embodiments of the present disclosure generally relate to methods of depositing metal-containing films. In particular, the disclosure relates to methods of providing metal-containing films for electronic devices.

BACKGROUND

Due to the miniaturization of microelectronic devices, semiconductor manufacturing is becoming a key inflection for materials innovation. Constant innovation of new materials and processes to deposit new materials are required. Two-dimensional metal-oxide semiconductor (MOS) transistor devices are shrinking in dimensions and moving toward fin shaped three-dimensional transistors. With the shrinking dimensions of the transistors, deposition of conformal thin films and tuning of the device threshold voltages are becoming more difficult.

Similarly, memory devices have decreasing dimensions with increased aspect ratios to a range the industry has never seen before. Therefore, a deposition method like atomic layer deposition (ALD) is often preferred due to an inherent surface limited growth process. In addition, thermal ALD is often preferred because plasma based ALD processes lead to substrate damage and non-conformal films.

Titanium nitride (TiN) films are used in logic and memory applications. TiN is expected to be a barrier material for tungsten, ruthenium, and cobalt. Additionally, TiN is used as the high-κ cap and as a p-metal material in gate stacks. Typically, thermal ALD TiN films are deposited by reacting titanium chloride ($TiCl_4$) and ammonia ($NH_3$) at temperatures greater than 400° C. in order to get appropriate resistivity in the film.

Accordingly, there is a need for methods of depositing metal-containing films with decreased resistivity and/or good conformality on high aspect ratio structures. There is a need for methods of depositing metal-containing films at lower temperatures Further, in advanced semiconductor logic/memory devices, especially when the dimension of the device keeps decreasing, there is a need for increasing work function and reducing equivalent oxide thickness (EOT) penalty in order to improve device performance.

SUMMARY

One or more embodiments of the disclosure are directed to methods of reducing equivalent oxide thickness (EOT) penalty in an electronic device. The methods comprise: exposing a substrate surface to a metal precursor; exposing the substrate surface to a reducing agent; and exposing the substrate surface to a reactant to form a metal-containing film comprising a metal nitride.

Additional embodiments of the disclosure are directed to methods of forming an electronic device. The methods comprise: sequentially exposing a surface to a metal halide precursor, a reducing agent, and a reactant to deposit a first metal-containing film comprising a metal nitride, the first metal-containing film defining a bottom electrode; depositing a high-κ dielectric layer on the bottom electrode; and sequentially exposing the high-κ dielectric layer to a metal halide precursor, a reducing agent, and a reactant to deposit a second metal-containing film comprising a metal nitride, the second metal-containing film defining a top electrode, the top electrode on the high-κ dielectric layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
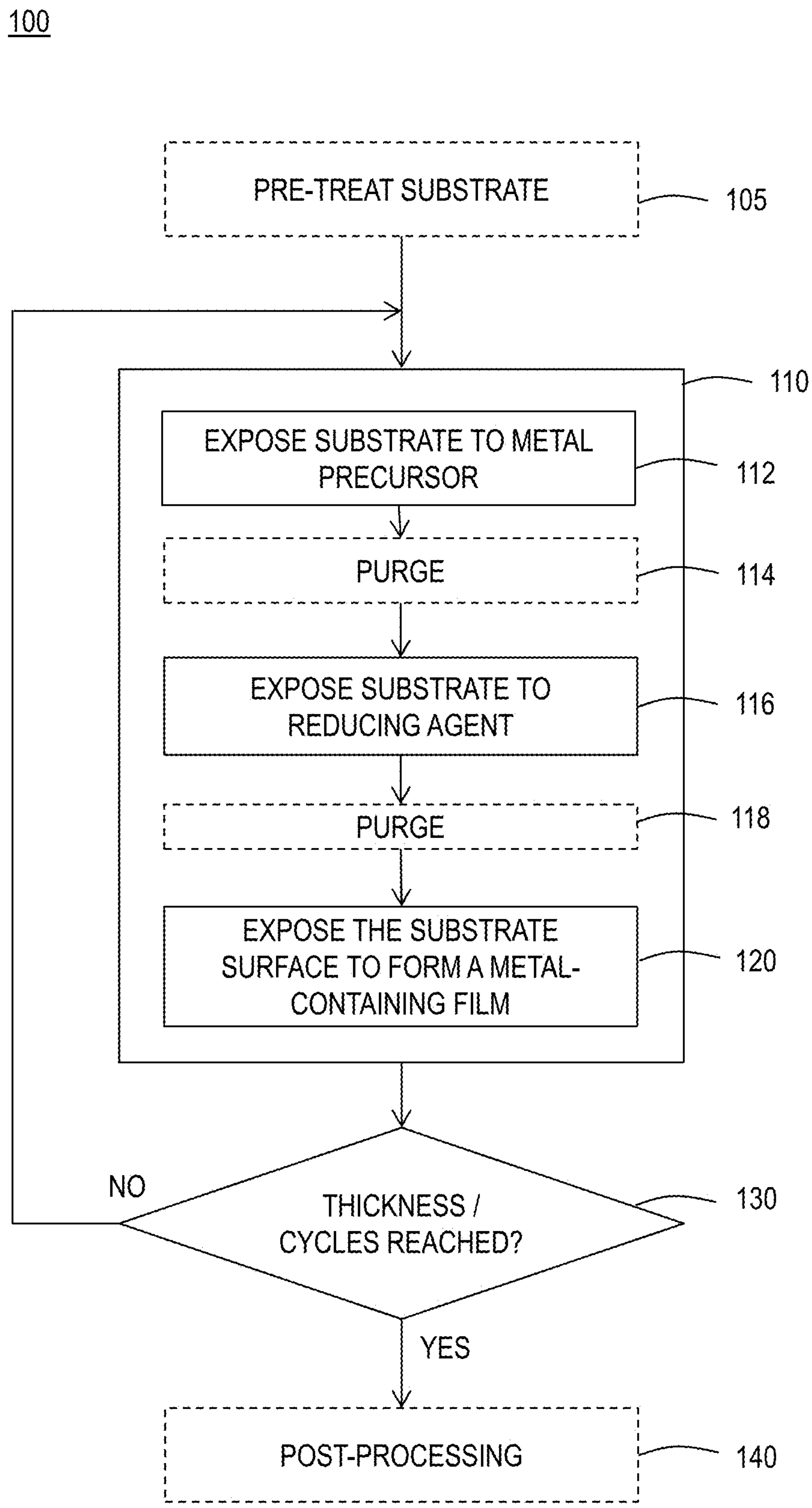
FIG. 1 illustrates an exemplary process for reducing equivalent oxide thickness (EOT) penalty in an electronic device.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

Transistors are circuit components or elements that are often formed on semiconductor devices. Many transistors may be formed on a semiconductor device in addition to capacitors, inductors, resistors, diodes, conductive lines, or other elements, depending upon the circuit design. The metal-oxide-semiconductor field-effect transistor (MOSFET) is a type of field-effect transistor (FET). It has an insulated gate, whose voltage determines the conductivity of the device. This ability to change conductivity with the amount of applied voltage is used for amplifying or switching electronic signals.

Generally, a transistor includes a gate formed between source and drain regions. The source and drain regions may include a doped region of a substrate and may exhibit a doping profile suitable for a particular application. The gate is positioned over the channel region and may include a gate dielectric interposed between a gate electrode and the channel region in the substrate.

As used herein, the term "field effect transistor" or "FET" refers to a transistor that uses an electric field to control the electrical behavior of the device. Field effect transistors generally display very high input impedance at low temperatures. The conductivity between the drain and source terminals is controlled by an electric field in the device, which is generated by a voltage difference between the body and the gate of the device. The FET's three terminals are source (S), through which the carriers enter the channel; drain (D), through which the carriers leave the channel; and gate (G), the terminal that modulates the channel conductivity. Conventionally, current entering the channel at the source (S) is designated Is and current entering the channel at the drain (D) is designated ID. Drain-to-source voltage is designated VDS. By applying voltage to gate (G), the current entering the channel at the drain (i.e., ID) can be controlled.

The metal-oxide-semiconductor field-effect transistor (MOSFET) is a type of field-effect transistor (FET) and is used in integrated circuits and high-speed switching applications. MOSFET has an insulated gate, whose voltage determines the conductivity of the device. This ability to change conductivity with the amount of applied voltage is used for amplifying or switching electronic signals. A MOSFET is based on the modulation of charge concentration by a metal-oxide-semiconductor (MOS) capacitance between a body electrode and a gate electrode located above the body and insulated from all other device regions by a gate dielectric layer. Compared to the MOS capacitor, the MOSFET includes two additional terminals (source and drain), each connected to individual highly doped regions that are separated by the body region. These regions can be either p or n type, but they are both be of the same type, and of opposite type to the body region. The source and drain (unlike the body) are highly doped as signified by a "+" sign after the type of doping.

If the MOSFET is an n-channel or nMOS FET, then the source and drain are n+ regions and the body is a p-type substrate region. If the MOSFET is a p-channel or pMOS FET, then the source and drain are p+ regions and the body is a n-type substrate region. The source is so named because it is the source of the charge carriers (electrons for n-channel, holes for p-channel) that flow through the channel; similarly, the drain is where the charge carriers leave the channel.

A nMOS FET is made up of a n-type source and drain and a p-type substrate. When a voltage is applied to the gate, holes in the body (p-type substrate) are driven away from the gate. This allows forming an n-type channel between the source and the drain and a current is carried by electrons from source to the drain through an induced n-type channel. Logic gates and other digital devices implemented using NMOSs are said to have NMOS logic. There are three modes of operation in a NMOS called the cut-off, triode, and saturation. Circuits with NMOS logic gates dissipate static power when the circuit is idling, since DC current flows through the logic gate when the output is low.

A pMOS FET is made up of p-type source and drain and a n-type substrate. When a positive voltage is applied between the source and the gate (negative voltage between gate and source), a p-type channel is formed between the source and the drain with opposite polarities. A current is carried by holes from source to the drain through an induced p-type channel. A high voltage on the gate will cause a PMOS not to conduct, while a low voltage on the gate will cause it to conduct. Logic gates and other digital devices implemented using PMOS are said have PMOS logic. PMOS technology is low cost and has a good noise immunity.

In a NMOS, carriers are electrons, while in a PMOS, carriers are holes. When a high voltage is applied to the gate, NMOS will conduct, while PMOS will not. Furthermore, when a low voltage is applied in the gate, NMOS will not conduct and PMOS will conduct. NMOS are considered to be faster than PMOS, since the carriers in NMOS, which are electrons, travel twice as fast as holes, which are the carriers in PMOS. But PMOS devices are more immune to noise than NMOS devices. Furthermore, NMOS ICs would be smaller than PMOS ICs (that give the same functionality), since the NMOS can provide one-half of the impedance provided by a PMOS (which has the same geometry and operating conditions).

As used herein, the term "dynamic random-access memory" or "DRAM" refers to a memory cell that stores a datum bit by storing a packet of charge (i.e., a binary one), or no charge (i.e., a binary zero) on a capacitor. The charge is gated onto the capacitor via an access transistor and sensed by turning on the same transistor and looking at the voltage perturbation created by dumping the charge packet on the interconnect line on the transistor output. Thus, a single DRAM cell is made of one transistor and one capacitor.

Embodiments of the present disclosure relate to methods for depositing metal-containing films. Some embodiments advantageously form metal nitride films with reduced resistivity. Some embodiments of the disclosure advantageously provide thermal atomic layer deposition (ALD) processes for depositing metal-containing films. As used in this manner, a "thermal" ALD process is an atomic layer deposition process in which a plasma reactant is not employed to deposit the film. A thermal ALD process can include a plasma based post-deposition process to control or modify some property of the film (e.g., density).

Some embodiments of the disclosure advantageously reduce the temperature to get a target resistivity and/or a lower overall resistivity. Some embodiments advantageously provide methods of reducing equivalent oxide thickness (EOT) penalty in electronic devices. Some embodiments advantageously provide metal-containing films that are useful in logic devices and memory devices. One or more embodiments advantageously provide metal-containing films that are useful in logic metal-insulator-metal capacitor (MIMCAP) electrodes, DRAM electrodes, and PMOS stacks. Some embodiments advantageously increase work function of the metal-containing film.

In the following description, numerous specific details, such as specific materials, chemistries, dimensions of the elements, etc. are set forth in order to provide thorough understanding of one or more of the embodiments of the present disclosure. It will be apparent, however, to one of ordinary skill in the art that one or more embodiments of the present disclosure may be practiced without these specific details. In other instances, semiconductor fabrication processes, techniques, materials, equipment, etc., have not been described in great detail to avoid unnecessarily obscuring this description. Those of ordinary skill in the art, with the included description, will be able to implement appropriate functionality without undue experimentation.

FIG. 1 illustrates an exemplary process 100 for reducing equivalent oxide thickness (EOT) penalty in an electronic device.

The process 100 illustrated in FIG. 1 is representative of an atomic layer deposition (ALD) process in which the substrate or substrate surface is exposed sequentially to the reactive gases in a manner that prevents or minimizes gas phase reactions of the reactive gases. In some embodiments, the process 100 comprises a chemical vapor deposition (CVD) process in which the reactive gases are mixed in the processing chamber to allow gas phase reactions of the reactive gases and deposition of the thin film. In some embodiments, the process 100 comprises co-flowing two or more of the reactive gases.

In some embodiments, the process 100 optionally includes a pre-treatment operation 105. The pre-treatment can be any suitable pre-treatment known to the skilled artisan. Suitable pre-treatments include, but are not limited to, pre-heating, cleaning, soaking, native oxide removal, or deposition of an adhesion layer (e.g., titanium nitride (TiN)). In one or more embodiments, an adhesion layer, such as titanium nitride, is deposited at operation 105. In other embodiments, an adhesion layer is not deposited.

In one or more embodiments, operation 105 includes a pre-treatment hydrogen anneal process. In one or more embodiments, the pre-treatment hydrogen anneal process occurs under a set of process conditions. In one or more embodiments, the set of process conditions include heat, pressure, and carrier gas. In one or more embodiments, the pre-treatment hydrogen anneal process comprises heating to a temperature in a range of from 70° C. to about 450° C. In one or more embodiments, the pre-treatment hydrogen anneal process comprises a pressure in a range of from 0.5 Torr to about 20 Torr. In one or more embodiments, the pre-treatment hydrogen anneal process comprises flowing in a range of from 100 sccm to 20000 sccm of hydrogen.

The process 100 includes forming a metal nitride film (operation 110) by exposing a substrate to a metal precursor (operation 112); optionally, purging the processing chamber or substrate surface of unreacted metal precursor (operation 114); exposing the substrate to a reducing agent (operation 116); optionally, purging the processing chamber of substrate surface of unreacted reducing agent (operation 118); exposing the substrate surface to a reactant (operation 120); and optionally, purging the processing chamber of substrate surface of unreacted reactant (operation 114/operation 118). At decision 130, the thickness of the deposited film, or number of cycles of metal precursor, reducing agent, and reactant is considered. If the deposited film has reached a predetermined thickness or a predetermined number of process cycles have been performed, the process 100 moves to an optional post-processing operation 140. If the thickness of the deposited film or the number of process cycles has not reached the predetermined threshold, the process 100 returns to operation 110 to expose the substrate surface to the metal precursor again in operation 112 and continues processing.

In one or more embodiments, the deposited film (e.g., the metal-containing film) has a thickness in a range of from 10 Å to 500 Å, or 20 Å to 450 Å, or 30 Å to 400 Å.

In one or more embodiments, the deposited film (e.g., the metal-containing film) has a resistivity less than or equal to 600 μΩ-cm. In one or more embodiments, the deposited film (e.g., the metal-containing film) has a resistivity less than or equal to 500 μΩ-cm, less than or equal to 400 μΩ-cm, less than or equal to 300 μΩ-cm, less than or equal to 200 μΩ-cm, or less than or equal to 100 μΩ-cm. In one or more embodiments, the deposited film (e.g., the metal-containing film) has a resistivity less than or equal to 75 μΩ-cm, less than or equal to 50 μΩ-cm, less than or equal to 25 μΩ-cm, less than or equal to 20 μΩ-cm, less than or equal to 15 μΩ-cm, less than or equal to 10 μΩ-cm, or less than or equal to 5 μΩ-cm.

The optional post-processing operation 140 can be, for example, a process to modify film properties (e.g., annealing) or a further film deposition process (e.g., additional ALD or CVD processes) to grow additional films. In some embodiments, the optional post-processing operation 140 can be a process that modifies a property of the deposited film. In some embodiments, the optional post-processing operation 140 comprises annealing the as-deposited film. In some embodiments, annealing is done at temperatures in the range of 300° C. to 900° C. The annealing environment of some embodiments comprises an inert gas (e.g., argon (Ar)) and a reducing gas (e.g., molecular hydrogen ($H_2$)). In one or more embodiments, the optional post-processing operation 140 comprises flowing in a range of from 100 sccm to 10,000 sccm of the inert gas and flowing in a range of from 100 sccm to 10,000 sccm of the reducing gas. Annealing can be performed for any suitable length of time. In some embodiments, the film is annealed for a predetermined time in the range of about 2 seconds to about 45 minutes, in the range of from about 30 seconds to 45 minutes, or in the range of about 1 minute to about 30 minutes. In some embodiments, the film is annealed for 25 minutes. In some embodiments, annealing the as-deposited film increases the density, decreases the resistivity and/or increases the purity of the film.

In some embodiments, the substrate surface is exposed to hydrogen ($H_2$) to decrease resistivity of the metal-containing film and/or reduce contaminants in the metal-containing film.

In some embodiments, the metal-containing film is treated with a plasma formed from one or more of hydrogen ($H_2$), nitrogen ($N_2$), or a silane ($Si_xH_y$) to increase work function of the metal-containing film.

Figure 2:
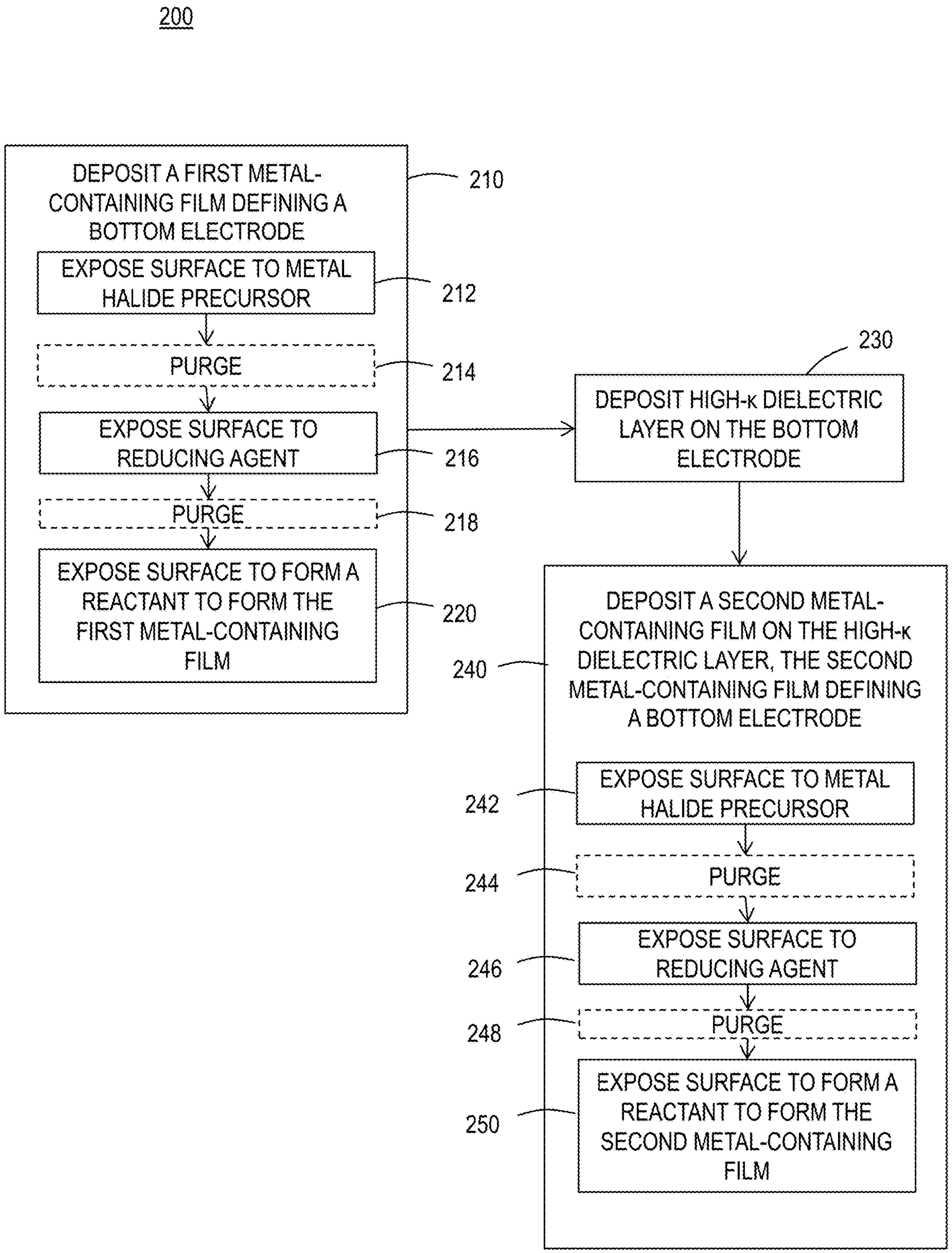
FIG. 2 illustrates an exemplary process for forming an electronic device.

FIG. 2 illustrates an exemplary process 200 for forming an electronic device. The process 200 may include any of the operations of process 100 described above and in FIG. 1. The process 200 includes, at operation 210, depositing a first metal-containing film and the first metal-containing film defines a bottom electrode. Depositing the first metal-containing film, at operation 210, comprises exposing a surface to a metal halide precursor (operation 212); optionally, purging the surface of unreacted metal halide precursor (operation 214); exposing the surface to a reducing agent (operation 216); optionally, purging the surface of unreacted reducing agent; exposing the surface to a reactant (operation 218); and optionally, purging the surface of unreacted reactant (operation 214/operation 218). The process 200 includes, at operation 230, depositing a high-κ dielectric layer on the bottom electrode. The process 200 includes, at operation 240, depositing a second metal-containing film on the high-κ dielectric layer. The second metal-containing film defines a top electrode. Depositing the second metal-containing film on the high-κ dielectric layer, at operation 240, comprises exposing the high-κ dielectric layer (i.e., the surface) to a metal halide precursor (operation 242); optionally, purging the surface of unreacted metal halide precursor (operation 244); exposing the surface to a reducing agent (operation 246); optionally, purging the surface of unreacted reducing agent; exposing the surface to a reactant (operation 248); and optionally, purging the surface of unreacted reactant (operation 244/operation 248).

Accordingly, one or more embodiments of the disclosure are directed to methods of forming metal-containing films. The metal films of some embodiments comprise metal atoms and nitrogen atoms.

In some embodiments, the metal precursor, reducing agent and reactant are simultaneously exposed to a substrate. In some embodiments, the reducing agent is exposed to the substrate with one of the metal precursors or reactants.

In some embodiments, the metal precursor, reducing agent and reactant are exposed to the substrate separately and sequentially. For example, in some embodiments, the substrate surface or process chamber is purged of one reactive gas prior to exposure to the next reactive gas. While examples are given throughout this specification with respect to the formation of titanium films, the skilled artisan will recognize that the disclosure is not limited to titanium and that any suitable metal can be used, as described herein.

In some embodiments, the substrate surface is exposed to a metal precursor having a metal with a first oxidation state. The substrate surface is exposed to a reducing agent to decrease the first oxidation state of the metal to a second oxidation state. The substrate surface is exposed to a reactant to form a metal-containing film comprising a metal nitride. The metal precursor, reducing agent and reactant in some embodiments are exposed to the substrate at the same time, such as, for example, in a chemical vapor deposition (CVD) process. In some embodiments, the reducing agent is exposed to the substrate surface at the same time as one of the metal precursors of the reactant. For example, in a hybrid chemical vapor deposition (CVD)—atomic layer deposition (ALD) process. In some embodiments, the metal precursor, reducing agent and reactant are separately and sequentially exposed to the substrate surface, such as, for example, in an atomic layer deposition (ALD) process. In some embodiments, two or more of the metal precursors, reducing agent and reactant are exposed to the substrate at the same time, such as, for example, in a co-flow process.

Some embodiments of the methods for forming metal-containing films comprise exposing a substrate surface to a metal halide precursor having a metal with a first oxidation state to form a metal-containing layer on the substrate surface. The metal-containing layer on the substrate surface is exposed to a reducing agent to decrease the first oxidation state of the metal to a second oxidation state and form a reduced metal-containing layer on the substrate surface. The reduced metal-containing layer on the substrate surface is exposed to a reactant to form a metal-containing film comprising a metal nitride.

The metal precursor can be any suitable metal precursor. In some embodiments, the metal precursor comprises a metal halide having the general formula $MX_aR_b$, where M is a metal atom, each X is a halogen independently selected from F, Cl, Br and I, each R is independently selected from C1-C6 alkyl, N-donor ligands, CO and cyclopentadienyl groups, a is in the range of 0 to 6 and b is in the range of 0 to 6. As used in this manner, the term "C1-C6", and use of 'C' followed by a numeral, means that the substituent group has the stated number of carbon atoms. For example, a C4 alkyl group has four carbon atoms. Suitable C4 alkyl groups include n-butyl, isobutyl, tert-butyl groups. In some embodiments, b is 0. In some embodiments, b is 0 and each X is the same element. As used in this manner, the term "each X is the same element" means that greater than or equal to about 95%, 98%, 99% or 99.5% of the halogen atoms comprise the stated atom.

This method can be extended to other metals and various metal precursors may be used to obtain low resistivity metal nitrides. The metal atom of the metal precursor comprises any suitable metal species. In some embodiments, the metal atom is selected from the group Ill through group XIV metals of the periodic table. Suitable metal species include, but are not limited to, scandium, yttrium, lanthanum, titanium, zirconium, hafnium, vanadium, niobium, tantalum, chromium, molybdenum, tungsten, manganese, technetium, rhenium, iron, ruthenium, osmium, cobalt, rhodium, iridium, nickel, palladium, platinum, copper, silver, gold, zinc, cadmium, boron, aluminum, gallium, indium, thallium, carbon, silicon, germanium, tin or lead.

In some embodiments, the metal atom is selected from the group consisting of titanium, gallium or tantalum. In some embodiments, the metal precursor comprises one or more of $TiCl_4$, $TaCl_5$, or $GaCl_3$. In some embodiments, the metal precursor consists essentially of one or more of $TiCl_4$, $TaCl_5$, or $GaCl_3$. As used in this manner, the term "consists essentially of" means that the reactive species of the metal precursor is greater than or equal to about 95%, 98%, 99% or 99.5% of the stated species on a molar basis. Inert of carrier gases are not considered in this calculation.

In some embodiments, the reducing agent comprises a cyclic 1,4-diene.

In some embodiments, the reducing agent has a general formula

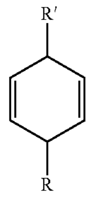

where each R and R' are independently selected from H, C1-C6 alkyl groups, —NR"$_2$ groups and —SiR"$_3$, where R" is selected from H, C1-C4 branched or unbranched alkyl groups.

In some embodiments, the reducing agent comprises or consists essentially of a compound with a general formula

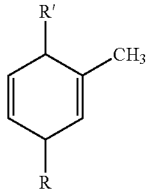

where each R and R' are independently selected from H, C1-C6 alkyl groups, —NR"$_2$ groups and —SiR"$_3$, where R" is selected from H, C1-C4 branched or unbranched alkyl groups In some embodiments, the reducing agent comprises or consists essentially of reducing agent (A)

(A)

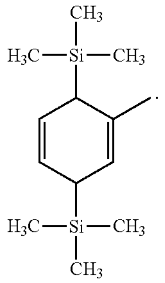

In some embodiments, the first oxidation state of the metal species is greater than or equal to 2+. In some embodiments, the first oxidation state of the metal species is greater than or equal to 3+, 4+, 5+ or 6+. In some embodiments, after exposure to the reducing agent the second oxidation state is less than or equal to 5+, 4+, 3+, 2+, 1+ or 0, and the second oxidation state is less than the first oxidation state.

In some embodiments, the reactant comprises a nitridation agent to form the metal nitride film. The nitridation agent of some embodiments comprises or consists essentially of ammonia. In some embodiments, nitridation agents other than ammonia are used. Suitable nitridation agents include, but are not limited to, hydrazines, amines, nitridation plasmas can be used. In some embodiments, the reactant comprises one or more of ammonia, a hydrazine, an amine or a nitriding plasma.

Without being bound by any particular theory of operation, it is believed that once the titanium metal center in $TiCl_4$ is reduced (from 4+ to less than 4+ oxidation state), the newly formed titanium surface becomes much more reactive than 4+ oxidation state which allows ammonia to react with the surface faster and cleaner. (The $Ti^{4+}$ oxidation state is the most stable form and less than 4+ is not as stable.)

In some embodiments, the reducing agent of some embodiments attracts Cl from $TiCl_4$, which lowers the chloride content of the film. It is believed that lowering the chloride content reduces film resistivity. In some embodiments, the metal precursor comprises a metal chloride and exposing the substrate surface to the reducing agent decreases a chlorine content of the film.

Scheme (1) depicts the reaction during one exemplary ALD cycle.

(I)

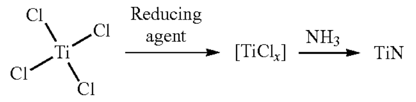

In some embodiments, the reducing agent comprises an organosilane reducing agent and the reaction between $TiCl_4$ and the reducing agent is believed to progress according to Scheme (11).

(II)

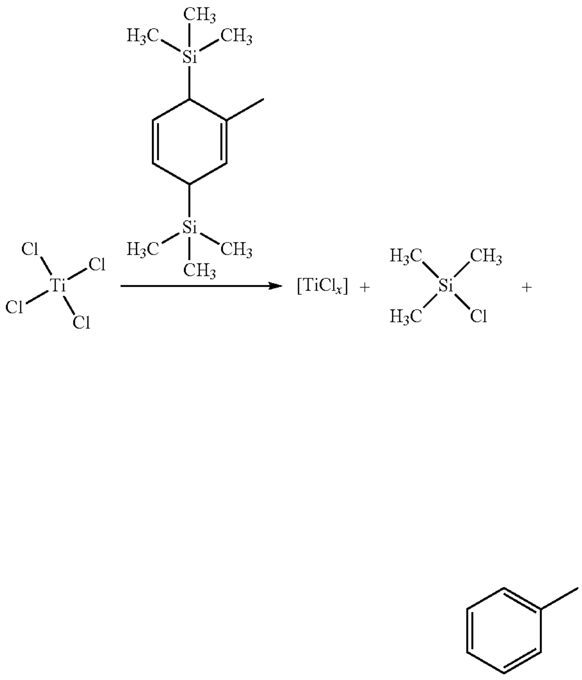

$TiCl_X$ is believed to be unstable and reactive towards ammonia. The possible reaction with ammonia is shown in Scheme (Ill) below.

(III)

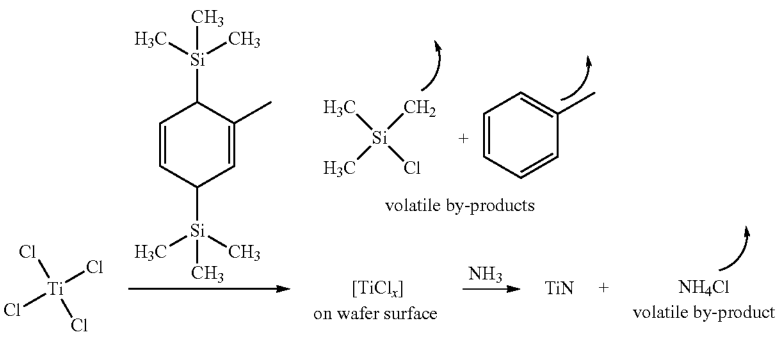

In some embodiments, the metal content of the metal-containing film is controlled by the reducing agent and/or the reactant. In some embodiments, the metal-containing film comprises a metal rich metal-containing film. As used in this manner, the term "metal-rich" and the like, means that the metal content of the film is greater than would be expected based on the stoichiometric ratio of atoms in the film. In some embodiments, the metal-containing film comprises a titanium rich titanium nitride film. In some embodiments, the metal-containing film comprises a tantalum rich tantalum nitride film. In some embodiments, the metal-containing film comprises a gallium rich tantalum nitride film.

In some embodiments, a mixed metal-containing film is formed. In some embodiments, the method further comprises exposing the substrate surface to more than one metal species from one or more of the metal precursor, reducing agent or reactant to form a mixed metal nitride film. The mixed metal of some embodiments is provided by using a mixed metal precursor (e.g., a mixture of one or more of titanium chloride ($TiCl_4$), gallium chloride ($GaCl_3$) or tantalum chloride ($TaCl_5$) to give a mixed TiGa film, a mixed TiTa film, or a mixed GaTa film). In some embodiments, one of or more of the metals are provided by the reducing agent or reactant.

The metal-containing films of some embodiments are deposited at temperatures less than or equal to about 600° C., 550° C., 500° C., 450° C., 400° C., 350° C., 300° C., 250° C., 200° C., 150° C. or 100° C.

Figure 3:
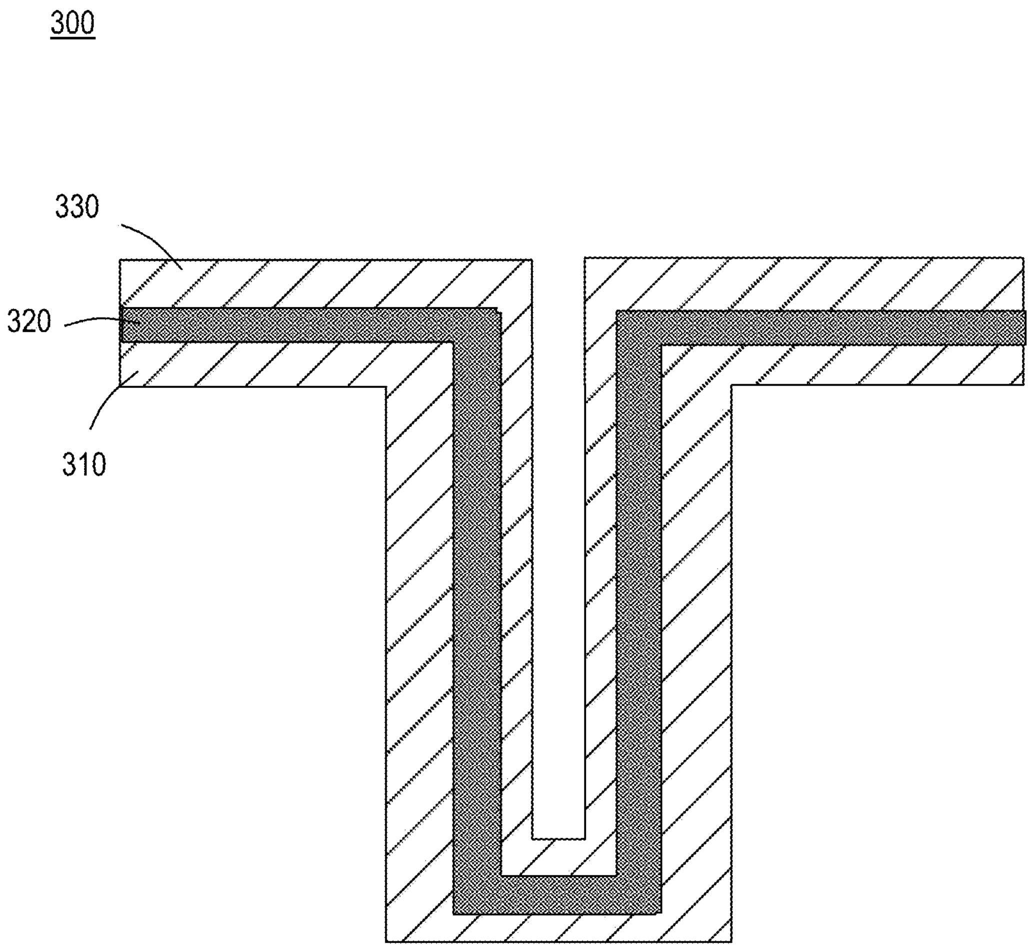
FIG. 3 illustrates a logic metal-insulator-metal capacitor (MIMCAP) electrode.
Figure 4:
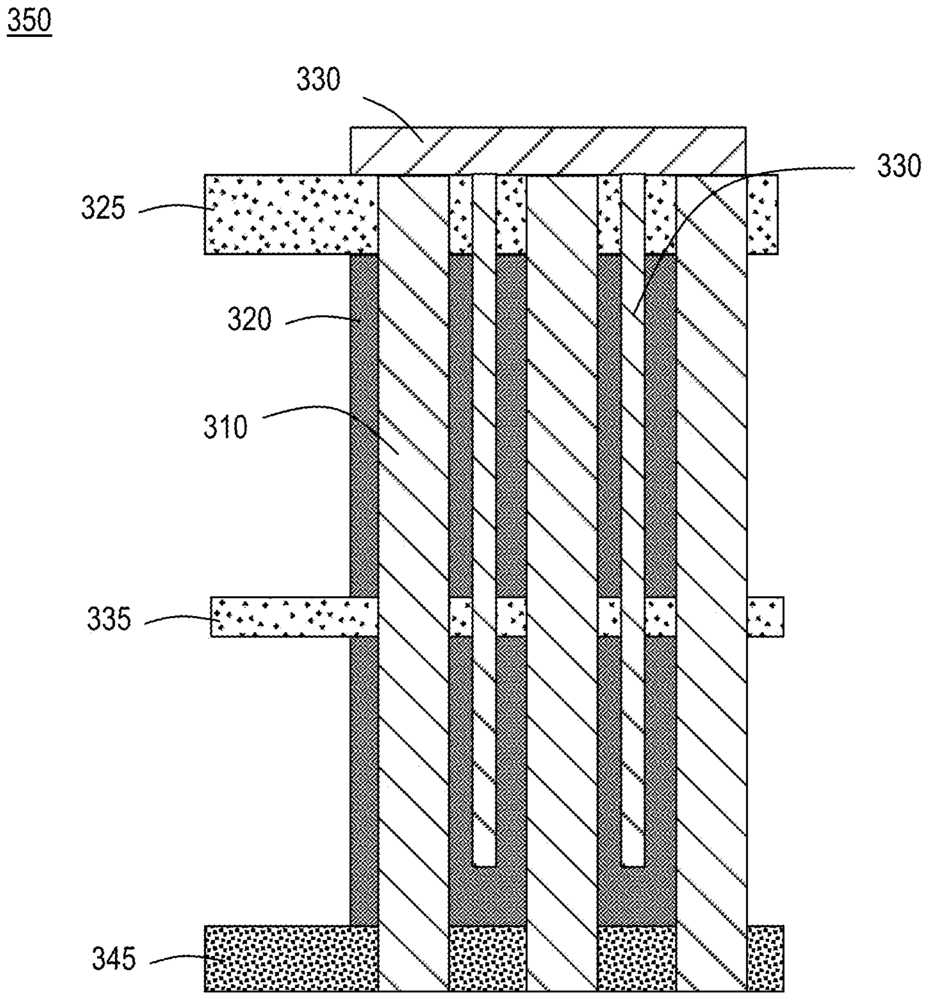
FIG. 4 illustrates an exemplary DRAM electrode.
Figure 5:
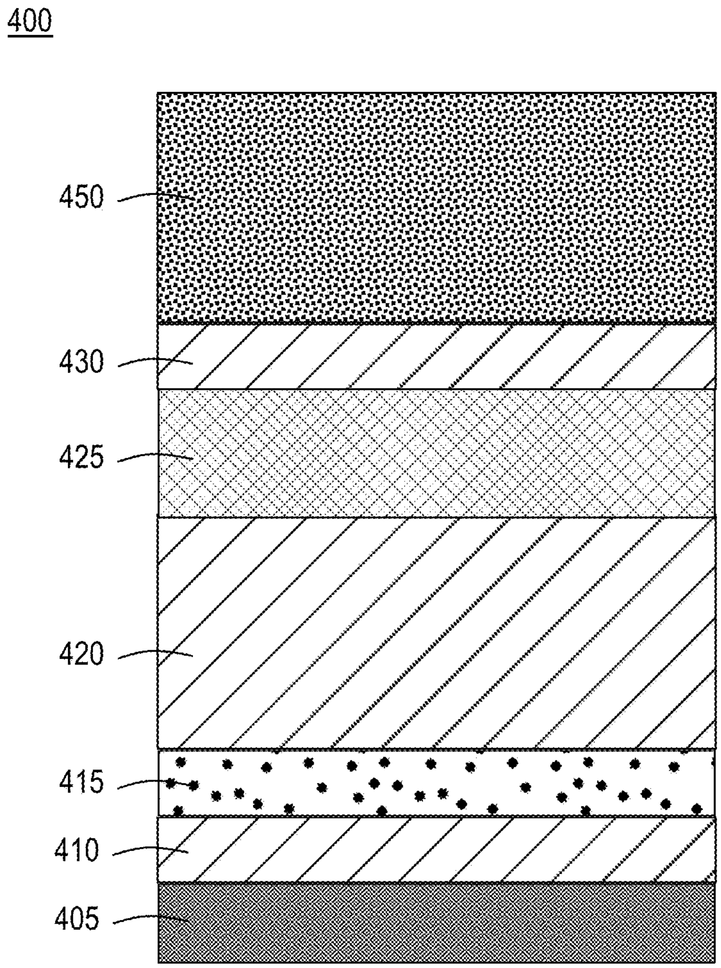
FIG. 5 illustrates an exemplary PMOS stack.

Some embodiments advantageously provide metal-containing films that are useful in logic devices and memory devices. One or more embodiments advantageously provide metal-containing films that are useful in logic metal-insulator-metal capacitor (MIMCAP) electrodes, DRAM electrodes, and PMOS stacks. FIG. 3 illustrates a logic metal-insulator-metal capacitor (MIMCAP) electrode 300. FIG. 4 illustrates an exemplary DRAM electrode 350. FIG. 5 illustrates an exemplary PMOS stack 400. In FIGS. 3-5, the semiconductor fabrication processes, techniques, materials, equipment, etc., that were used to form the devices shown in FIGS. 3-5, will not be described in great detail to avoid unnecessarily obscuring this description. Those of ordinary skill in the art, with the included description, will be able to implement appropriate functionality without undue experimentation.

Referring to FIG. 3, the logic MIMCAP electrode 300 comprises a bottom electrode 310, a high-κ dielectric layer 320 on the bottom electrode 310, and a top electrode 330 on the high-κ dielectric layer 320. One or more of the bottom electrode 310 or the top electrode 330 includes the metal-containing film described herein. The high-κ dielectric layer 320 can be any suitable high-κ dielectric material known to the skilled artisan. In one or more embodiments, the high-κ dielectric layer 320 comprises one or more of hafnium oxide (HfOx), zirconium oxide (ZrOx), hafnium zirconium oxide (HfZrOx), or a spin-on dielectric.

Referring to FIG. 4, the DRAM electrode 350 comprises a bottom electrode 310, a high-κ dielectric layer 320 on the bottom electrode 310, and a top electrode 330 on the high-κ dielectric layer 320. In some embodiments, the DRAM electrode 350 comprises a top supporter 325, a mid supporter 335, and a stopper 345.

In some embodiments, the top electrode 330 defines a top surface of the DRAM electrode 350, and the stopper 345 defines a bottom surface of the DRAM electrode 350. In some embodiments, the remaining components of the DRAM electrode 350, such as, the bottom electrode 310, the high-κ dielectric layer 320, the top supporter 325, and the mid supporter 335, are each positioned between the top electrode 330 and the stopper 345.

In one or more embodiments, the bottom electrode 310 serves as one of the metal plates of a capacitor (e.g., the DRAM electrode 250). In one or more embodiments, the bottom electrode 310 stores charges and allows the movement of charges. The bottom electrode 310 may define any suitable shape. In one or more embodiments, the bottom electrode 310 is a pillar. Accordingly, in one or more non-limiting embodiments and for descriptive purposes, the terms "bottom electrode 310", "bottom electrode pillar 310", and "bottom pillar electrode 310" may be used interchangeably. In one or more unillustrated embodiments, the bottom electrode 310 is a cylinder.

The high-κ dielectric layer 320 is located between the metal plates (e.g., the bottom electrode 310 and the top electrode 330, and acts as an electrical barrier. Without intending to be bound by theory, the high-κ dielectric layer 320 prevents charge leakage or movement through other components in the DRAM electrode 350. In some embodiments, the top electrode 330 is located on the opposite side of the bottom electrode 310. In some embodiments, the top electrode 330 stores charges and allows the movement of charges.

The top supporter 325 is located on a top side of the capacitor and acts as electrical barrier of adjacent bottom electrode pillars 310 and acts as a mechanical support for each bottom electrode pillar 310. The top supporter 325 may include any suitable material known to the skilled artisan. In some embodiments, the top supporter 325 comprises a dielectric material.

In one or more embodiments, the mid supporter 335 is located in the middle of bottom electrode pillar 310. In some embodiments, the mid supporter 335 acts as an electrical barrier of adjacent electrodes and acts as a mechanical support for each bottom pillar electrode 310. The mid supporter 335 may include any suitable material known to the skilled artisan. In some embodiments, the mid supporter 335 comprises a dielectric material.

In one or more embodiments, the stopper 345 is located on the bottom of bottom pillar electrode 310. In some embodiments, the stopper 345 defines the bottom surface of the DRAM electrode 350. In some embodiments, the stopper 345 acts as an electrical barrier of adjacent bottom electrode pillars 310 and acts as a dry etching stopper during pillar formation dry etching. The stopper 345 may include any suitable material known to the skilled artisan. In some embodiments, the stopper 345 comprises a dielectric material.

One or more of the bottom electrode 310 or the top electrode 330 includes the metal-containing film described herein. The high-κ dielectric layer 320 can be any suitable high-κ dielectric material known to the skilled artisan. In one or more embodiments, the high-κ dielectric layer 320 comprises one or more of hafnium oxide (HfOx), zirconium oxide (ZrOx), hafnium zirconium oxide (HfZrOx), or a spin-on dielectric. In some embodiments, the top supporter 325 is positioned below the top electrode 330 and above the stopper 345. The top supporter 325 comprises any suitable dielectric material known to the skilled artisan. In some embodiments, the top supporter 325 comprises silicon nitride (SiN).

In some embodiments, the mid supporter 335 is positioned between the top supporter 325 and the stopper 345. The top supporter 325 comprises any suitable dielectric material known to the skilled artisan. In some embodiments, the top supporter 325 comprises silicon nitride (SiN). The stopper 345 comprises any suitable dielectric material known to the skilled artisan. In some embodiments, the stopper 345 comprises silicon nitride (SiN).

Referring to FIG. 5, the PMOS stack 400 comprises a high-κ dielectric layer 405, a capping layer 410 on the high-κ dielectric layer 405, an etch stop layer 415 on the capping layer 410, a p-type work-function (pWF) metal layer 420 on the etch stop layer 415, an n-type work-function (nWF) metal layer 425 on the pWF metal layer 420, an N-metal capping layer 430 on the nWF metal layer 425, and a fill layer 450 on the N-metal capping layer 430.

In one or more embodiments, the PMOS stack 400 comprises a high-κ dielectric layer 405, one or more of a capping layer 410 and an etch stop layer 415 on the on the high-κ dielectric layer 405, a p-type work-function (pWF) metal layer 420 on the one or more of the capping layer 410 and the etch stop layer 415, an n-type work-function (nWF) metal layer 425 on the pWF metal layer 420, an N-metal capping layer 430 on the nWF metal layer 425, and a fill layer 450 on the N-metal capping layer 430.

The layers of the PMOS stack 400 may have any suitable thickness. In some embodiments, the high-κ dielectric layer 405 has a thickness of about 19 Å. In some embodiments, the capping layer 410 has a thickness of about 10 Å. In some embodiments, the etch stop layer 415 has a thickness of about 10 Å. In some embodiments, the pWF metal layer 420 has a thickness of about 40 Å. In some embodiments, the nWF metal layer 425 has a thickness of about 30 Å. In some embodiments, the N-metal capping layer 430 has a thickness of about 25 Å. In some embodiments, the fill layer 450 has a thickness of about 40 Å.

The high-κ dielectric layer 405 can be any suitable high-κ dielectric material known to the skilled artisan. In one or more embodiments, the high-κ dielectric layer 405 comprises one or more of hafnium oxide (HfOx), zirconium oxide (ZrOx), hafnium zirconium oxide (HfZrOx), or a spin-on dielectric.

In some embodiments, one or more layers of the PMOS stack 400 comprise the metal-containing film formed in process 100 and/or process 200. In some embodiments, one or more layers of the PMOS Stack 400 comprise the titanium nitride film formed in process 100 and/or process 200. In some embodiments, one or more of the capping layer 410, the pWF metal layer 420, or the N-metal capping layer 430 comprises the titanium nitride film formed in process 100 and/or process 200.

In an exemplary PMOS stack 400, the stack comprises a high-κ dielectric layer 405 comprising one or more of hafnium oxide (HfOx), zirconium oxide (ZrOx), hafnium zirconium oxide (HfZrOx), or a spin-on dielectric, a capping layer 410 comprising the titanium nitride film formed in process 100 and/or process 200 on the high-κ dielectric layer 405, an etch stop layer 415 comprising tantalum nitride on the capping layer 410, a p-type work-function (pWF) metal layer 420 comprising the titanium nitride film formed in process 100 and/or process 200 on the etch stop layer 415, an n-type work-function (nWF) metal layer 425 comprising titanium aluminum carbide on the pWF metal layer 420, an N-metal capping layer 430 comprising the titanium nitride film formed in process 100 and/or process 200 on the nWF metal layer 425, and a fill layer 450 comprising tungsten on the N-metal capping layer 430.

The materials defining the high-κ dielectric layer 405, the etch stop layer 410, the nWF metal layer 425, and the fill layer 450 may be formed by any suitable deposition process. In some embodiments, one or more of the high-κ dielectric layer 405, the etch stop layer 410, the nWF metal layer 425, and the fill layer 450 is formed by atomic layer deposition (ALD). In some embodiments, one or more of the high-κ dielectric layer 405, the etch stop layer 410, the nWF metal layer 425, and the fill layer 450 is formed by chemical vapor deposition (CVD). In some embodiments, the high-κ dielectric layer 405 is formed by ALD, the etch stop layer 415 is formed by ALD, the nWF metal layer is formed by ALD, and the fill layer 450 is formed by CVD.

Figure 6:
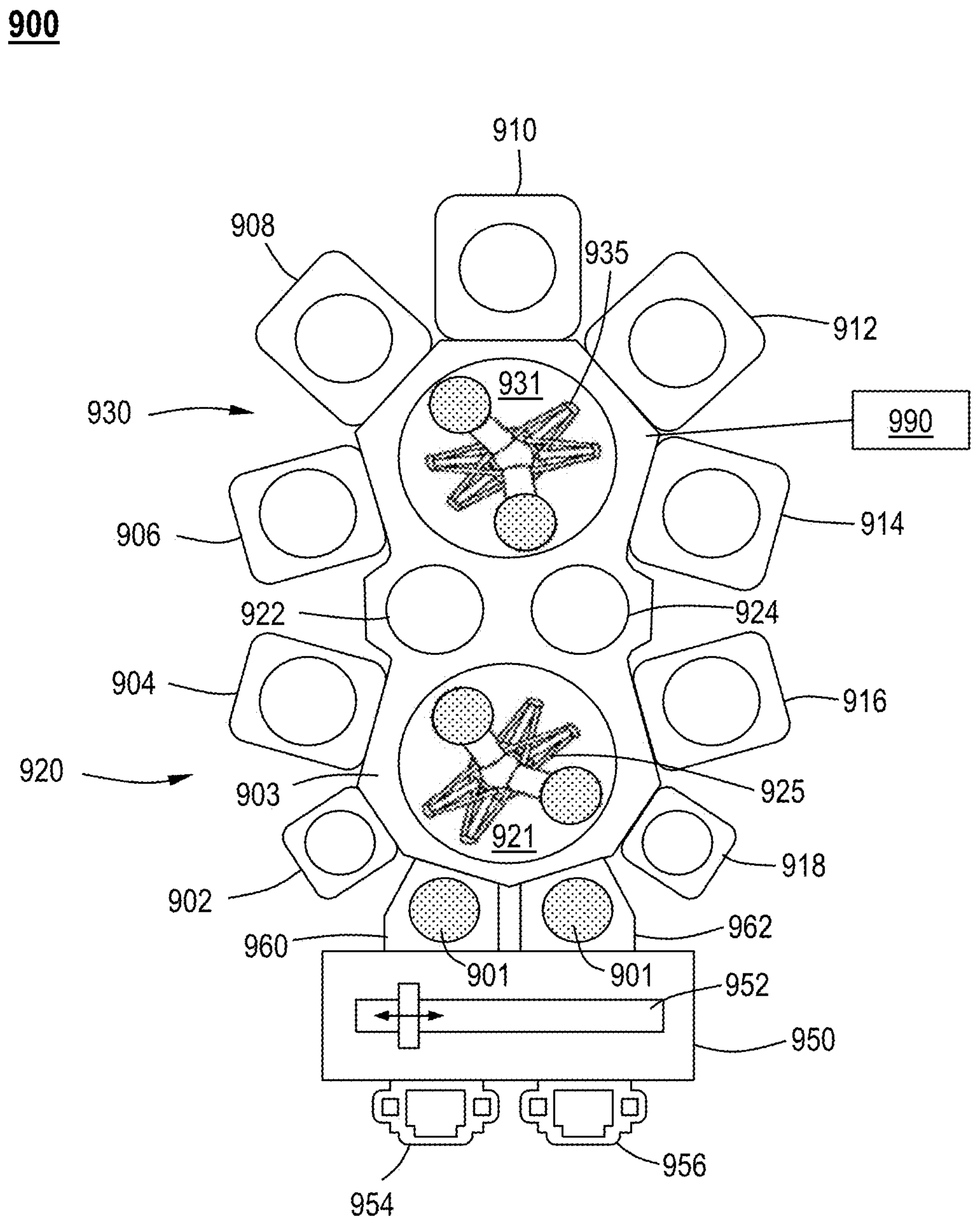
FIG. 6 illustrates a cluster tool.

Additional embodiments of the disclosure are directed to processing tools 900 for the formation of the electronic devices and methods described, as shown in FIG. 6.

The cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, a preclean chamber, a buffer chamber, transfer space(s), a wafer orienter/degas chamber, a cryo cooling chamber, a deposition chamber, annealing chamber, etching chamber, a thermal processing (RTP) chamber, a plasma oxidation chamber, a plasma nitridation chamber, and an atomic layer deposition (ALD) chamber. The particular arrangement of process chambers and components can be varied depending on the cluster tool and should not be taken as limiting the scope of the disclosure.

In the embodiment shown in FIG. 6, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In one or more embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930, or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit, memory, suitable circuits and storage.

Processes may generally be stored in the memory of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In one or more embodiments, the processing tool 900 comprises a central transfer station 921, 931 comprising at least one robot 925, 935 configured to perform the processes described herein (e.g., process 100 and/or process 200).

One or more embodiments of the disclosure are directed to a non-transitory computer readable medium including instructions, that, when executed by a controller of a processing chamber, cause the processing chamber to perform the operations of process 100. Some embodiments of the disclosure are directed to a non-transitory computer readable medium including instructions, that, when executed by a controller of a processing chamber, cause the processing chamber to perform the operations of process 200.

A generic methodology for formation of the metal-containing film according to some embodiments comprises vaporizing a metal precursor to an ALD chamber followed by inert purge of excess metal precursor and by-products. Then, a reducing agent is vaporized and flowed to the chamber. When the reducing agent interacts with surface bound metal precursor species, the metal center gets reduced to a lower oxidation state and a reactive surface is formed. Then, an inert gas purge is applied to remove all unreacted molecules and by-products. After that, a nitridation agent such as ammonia is delivered to the chamber. Ammonia reacts with the surface to form metal nitride film. This cycle can be repeated as many times to get the desired thickness. The chamber pressure and temperature can be maintained from 1 torr to 50 torr and 100° C. to 530° C., respectively.

Example: Deposition of TiN Films $TiCl_4$, reducing agent A and ammonia were employed in ALD fashion to deposit low resistivity TiN films. A silicon oxide substrate was heated to 400° C. in an ALD chamber. Then ALD pulse sequence was carried out as follows; $TiCl_4$ pulse of 0.3 seconds followed by 10 s nitrogen purge, 2 s pulse of reducing agent A, followed by 10 s nitrogen purge, and 6 s pulse of ammonia followed by 30 s nitrogen purge. The cycle was repeated to deposit a film with a predetermined thickness. This process was carried out at different temperatures and, growth rate and resistivities were measured. Comparison of growth rate along with resistivity data from above-mentioned procedure and the baseline process (TiN without reducing agent A) showed a clear increase in growth rate and decrease in resistivity. Compositional analysis of the films showed an increase in the titanium to nitrogen ratio.

Spatially relative terms, such as “beneath,” “below,” “lower,” “above,” “upper” and the like, may be used herein for ease of description to describe one element or feature’s relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of reducing equivalent oxide thickness (EOT) penalty in an electronic device, the method comprising:

exposing a substrate surface to a metal precursor;

exposing the substrate surface to a reducing agent, wherein the reducing agent comprises:

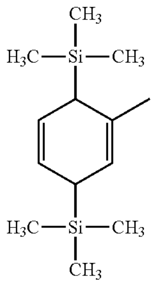

;

and exposing the substrate surface to a reactant to form a metal-containing film comprising a metal nitride, wherein the metal-containing film is a metal rich metal-containing film having a metal content greater than a stoichiometric ratio of other atoms therein.

2. The method of claim 1, wherein the metal precursor comprises a metal halide having a general formula $MX_aR_b$, where M is a metal atom, each X is a halogen independently selected from F, Cl, Br, and I, each R is independently selected from a C1-C6 alkyl, an N-donor ligand, a carbonyl, or a cyclopentadienyl, a is in a range of 0 to 6, and b is in a range of 0 to 6.

3. The method of claim 2, wherein for the general formula $MX_aR_b$, a is in a range of 1 to 5 and b is in a range of 0 to 1.

4. The method of claim 2, wherein the metal atom is selected from titanium, gallium, or tantalum.

5. The method of claim 2, wherein the metal precursor comprises one or more of titanium chloride, gallium chloride, or tantalum chloride.

6. The method of claim 1, wherein the metal precursor comprises a metal chloride and exposing the substrate surface to the reducing agent decreases a chlorine content of the metal-containing film.

7. The method of claim 1, wherein the reactant comprises a nitridation agent to form a metal nitride film.

8. The method of claim 1, wherein the metal-containing film comprises a metal-rich metal nitride film.

9. The method of claim 1, wherein the reactant comprises one or more of ammonia, a hydrazine, an amine, or a nitriding plasma.

10. The method of claim 1, further comprising exposing the substrate surface to hydrogen ($H_2$) to decrease resistivity of the metal-containing film and/or reduce contaminants in the metal-containing film.

11. The method of claim 1, further comprising treating the metal-containing film with a plasma formed from one or more of hydrogen ($H_2$), nitrogen ($N_2$), or a silane to increase work function of the metal-containing film.

12. The method of claim 1, wherein the substrate surface is sequentially and separately exposed to the metal precursor, the reducing agent, and the reactant.

13. The method of claim 1, wherein the substrate surface is exposed to a co-flow of two or more of the metal precursor, the reducing agent, or the reactant.

14. A method of forming an electronic device, the method comprising:

sequentially exposing a surface to a first metal halide precursor, a first reducing agent, and a first reactant to deposit a first metal-containing film comprising a metal nitride, the first metal-containing film defining a bottom electrode, wherein the first metal-containing film is a first metal rich metal-containing film having a metal content greater than a stoichiometric ratio of other atoms therein, depositing a high-k dielectric layer on the bottom electrode; and sequentially exposing the high-k dielectric layer to a second metal halide precursor, a second reducing agent, wherein the second reducing agent comprises:

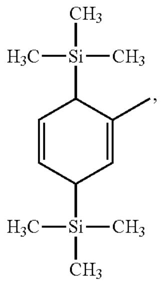

and a second reactant to deposit a second metal-containing film comprising a metal nitride, the second metal-containing film defining a top electrode, the top electrode on the high-k dielectric layer, wherein the second metal-containing film is a second metal rich metal-containing film having a metal content greater than a stoichiometric ratio of other atoms therein.

15. The method of claim 14, wherein the electronic device is a logic device.

16. The method of claim 14, wherein the electronic device is a memory device.

17. A method of reducing equivalent oxide thickness (EOT) penalty in an electronic device, the method comprising:

exposing a substrate surface to a metal precursor, wherein the metal precursor comprises a metal halide having a general formula $MX_aR_b$, where M is a metal atom, each X is a halogen independently selected from F, Cl, Br and I, each R is independently selected from a C1-C6 alkyl, an N-donor ligand, a carbonyl, or a cyclopentadienyl, a is in a range of 1 to 6, and b is in a range of 1 to 6; then exposing the substrate surface to a reducing agent; and then exposing the substrate surface to a reactant to form a metal-containing film comprising a metal nitride, wherein the metal-containing film is a metal rich metal-containing film having a metal content greater than a stoichiometric ratio of other atoms therein, and wherein the reducing agent comprises:

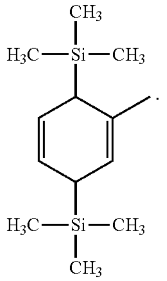

* * * * *